(12) United States Patent
Shimomura et al.

(10) Patent No.: US 11,268,207 B2
(45) Date of Patent: Mar. 8, 2022

(54) REGULATION PLATE, ANODE HOLDER, AND SUBSTRATE HOLDER

(71) Applicant: EBARA CORPORATION, Tokyo (JP)

(72) Inventors: Naoki Shimomura, Tokyo (JP); Mizuki Nagai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 56 days.

(21) Appl. No.: 16/630,369

(22) PCT Filed: Jul. 6, 2018

(86) PCT No.: PCT/JP2018/025622
§ 371 (c)(1),
(2) Date: Jan. 10, 2020

(87) PCT Pub. No.: WO2019/013111
PCT Pub. Date: Jan. 17, 2019

(65) Prior Publication Data
US 2020/0157702 A1  May 21, 2020

(30) Foreign Application Priority Data

Jul. 11, 2017 (JP) .............................. JP135370/2017

(51) Int. Cl.
*H01L 21/288* (2006.01)
*C25D 17/06* (2006.01)
*C25D 17/00* (2006.01)

(52) U.S. Cl.
CPC ......... *C25D 17/008* (2013.01); *C25D 17/001* (2013.01); *C25D 17/007* (2013.01); *C25D 17/06* (2013.01); *H01L 21/2885* (2013.01)

(58) Field of Classification Search
CPC ........................................... C25D 17/007–008
See application file for complete search history.

(56) References Cited

U.S. PATENT DOCUMENTS

2016/0194780 A1  7/2016  Nagai et al.
2017/0058423 A1  3/2017  Mine et al.

FOREIGN PATENT DOCUMENTS

| CN | 202323066 U | 7/2012 |
|---|---|---|
| JP | H06-017297 A | 1/1994 |
| JP | 2005-029863 A | 2/2005 |
| JP | 2008-088522 A | 4/2008 |
| JP | 2013-112842 A | 6/2013 |
| JP | 2016-127069 A | 7/2016 |
| JP | 2017-043815 A | 3/2017 |
| JP | 2018-193608 A | 12/2018 |

OTHER PUBLICATIONS

Ban, Machine Translation, CN 202323066 U (Year: 2012).*
International Patent Application No. PCT/JP2018/025622; Int'l Search Report; dated Aug. 21, 2018; one page.

* cited by examiner

*Primary Examiner* — Ho-Sung Chung
(74) *Attorney, Agent, or Firm* — BakerHostetler

(57) ABSTRACT

To partially or locally control a plating film thickness on a polygonal substrate. There is provided a regulation plate for adjusting a current between an anode and the polygonal substrate. This regulation plate includes a main body that has an edge forming a polygonal opening through which the current passes and an attachable/detachable shielding member to shield at least a part of the polygonal opening.

5 Claims, 9 Drawing Sheets

REGULATION PLATE, ANODE HOLDER, AND SUBSTRATE HOLDER

TECHNICAL FIELD

The present invention relates to a regulation plate, an anode holder, and a substrate holder.

BACKGROUND ART

Conventionally, wiring, bumps (protruding electrodes), and the like have been formed on a surface of a substrate such as a semiconductor wafer and a printed substrate. As a method for forming such wiring, bumps, and the like, an electrolytic plating method has been known.

With a plating apparatus used in an electrolytic plating method, generally, a plating process is performed on, for example, a circular-shaped substrate, such as a wafer, having a diameter of 300 mm. However, in the recent semiconductor market, from the aspect of cost-effectiveness, not only such a circular-shaped substrate, but also a square shaped substrate has been increasingly demanded, and therefore, it is desired to perform plating and the like on the polygonal substrate. A plating apparatus that plates the polygonal substrate is disclosed, for example, in PTL 1.

CITATION LIST

Patent Literature

PTL 1: Japanese Unexamined Patent Application Publication No. 2017-043815

SUMMARY OF INVENTION

Technical Problem

For plating the circular-shaped substrate, it is generally desired to form a plating film of a uniform film thickness on a substrate surface. Meanwhile, it is possible that, in a polygonal substrate, there are some cases where a wiring pattern and the like disposed on the polygonal substrate are not uniform, and pattern densities or pattern shapes differ depending on a position. In this case, plating the polygonal substrate requires to thicken or thin the plating film thickness only on a predetermined portion on the polygonal substrate unlike plating of the circular-shaped substrate. Accordingly, in plating of the polygonal substrate, it is preferred that the film thickness of the plating can be purposely controlled partially or locally within a surface of the substrate.

The present invention has been made in view of the above-described problem. One of its objectives is to partially or locally control a plating film thickness on a polygonal substrate.

Solution to Problem

According to one configuration of the present invention, there is provided a regulation plate for adjusting a current between an anode and a polygonal substrate. This regulation plate includes a main body and an attachable/detachable shielding member. The main body has an edge forming a polygonal opening through which the current passes. The shielding member is to shield at least a part of the polygonal opening.

According to another configuration of the present invention, there is provided an anode holder configured to hold an anode. This anode holder includes a holder main body, an anode mask, and an attachable/detachable shielding member. The holder main body holds the anode. The anode mask is mounted on the holder main body. The anode mask has a polygonal opening. The anode mask shields a peripheral portion of the anode. The shielding member is to shield at least a part of the polygonal opening.

According to another configuration of the present invention, there is provided a substrate holder for holding a polygonal substrate. This substrate holder includes a holder main body and an attachable/detachable shielding member. The holder main body has an edge forming a polygonal opening to expose the held polygonal substrate. The shielding member is to shield at least a part of the polygonal opening.

DESCRIPTION OF EMBODIMENTS

Figure 1:
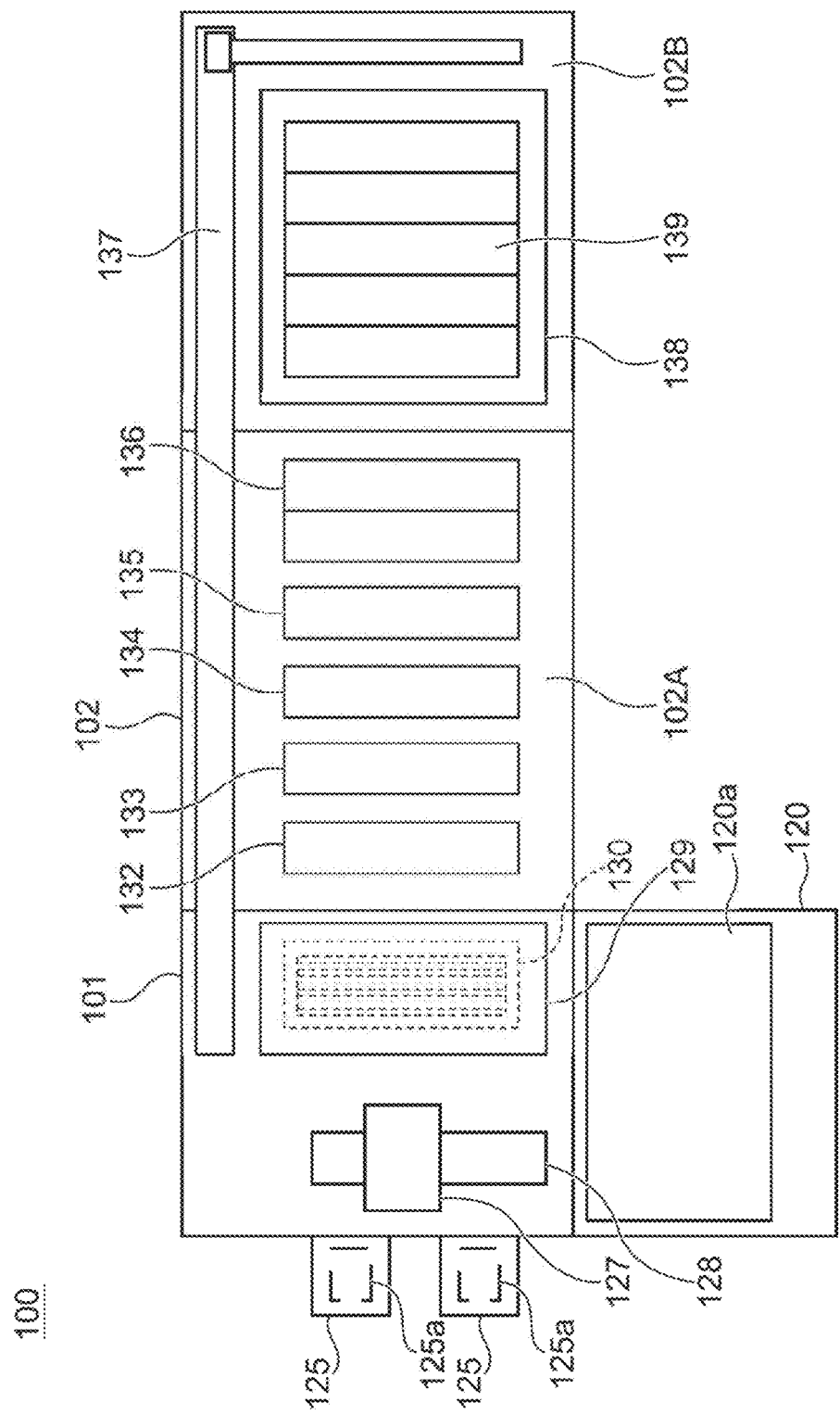
FIG. 1 is an entire layout drawing of a plating apparatus according to an embodiment.

The following describes embodiments of the present invention with reference to the drawings. In the drawings described later, the identical reference numerals are used for the identical or equivalent components, and therefore such components will not be further elaborated here. FIG. 1 is an entire layout drawing of a plating apparatus according to an embodiment. As illustrated in FIG. 1, this plating apparatus 100 is roughly divided into a loading/unloading unit 101, which loads a polygonal substrate to a substrate holder or unloads the polygonal substrate from the substrate holder, a processing unit 102, which processes the polygonal substrate, and a cleaning unit 120. The processing unit 102 further includes a preprocessing/postprocessing unit 102A, which performs preprocessing and postprocessing on the polygonal substrate, and a plating processing unit 102B, which performs a plating process on the polygonal substrate. The loading/unloading unit 101, the processing unit 102, and the cleaning unit 120 of the plating apparatus 100 are respectively surrounded by different frames (housing).

The loading/unloading unit 101 includes two cassette tables 125 and a removal/mounting mechanism 129. The cassette table 125 includes a cassette 125a that houses the polygonal substrate. The removal/mounting mechanism 129 is configured to mount/remove the polygonal substrate on/from the substrate holder (not illustrated). A stocker 130 to house the substrate holder is disposed at the proximity of (for example, under) the removal/mounting mechanism 129. In the center of these units 125, 129, and 130, a transfer device 127 formed of a robot for transfer that transfers the polygonal substrate between these units is arranged. The transfer device 127 is configured to run with a running mechanism 128.

The cleaning unit 120 includes a cleaning device 120a that cleans and dries the polygonal substrate after the plating process. The transfer device 127 is configured to transfer the polygonal substrate after the plating process to the cleaning device 120a and take out the cleaned and dried polygonal substrate from the cleaning device 120a.

The preprocessing/postprocessing unit 102A includes a pre-wet tank 132, a pre-soak tank 133, a pre-rinse tank 134, a blow tank 135, and a rinse tank 136. In the pre-wet tank 132, the polygonal substrate is immersed in a pure water. In the pre-soak tank 133, an oxide film on a surface of a conducting layer such as a seed layer formed on a surface of the polygonal substrate is removed by etching. In the pre-rinse tank 134, the polygonal substrate after pre-soak is cleaned with a cleaning liquid (for example, pure water) together with the substrate holder. In the blow tank 135, liquid draining of the polygonal substrate after cleaning is performed. In the rinse tank 136, the polygonal substrate after plating is cleaned with the cleaning liquid together with the substrate holder. The pre-wet tank 132, the pre-soak tank 133, the pre-rinse tank 134, the blow tank 135, and the rinse tank 136 are arranged in this order.

The plating processing unit 102B includes a plurality of plating devices 139 including an overflow tank 138. Each plating device 139 internally houses one polygonal substrate and immerses the polygonal substrate in a plating solution internally held to perform plating such as copper plating on the polygonal substrate surface. Here, a type of the plating solution is not especially limited, and various plating solutions are used as usage.

The plating apparatus 100 includes a transfer device 137 positioned lateral to these respective devices. The transfer device 137 employs, for example, a linear motor system to transfer the substrate holder between these respective devices together with the polygonal substrate. This transfer device 137 is configured to transfer the substrate holder between the removal/mounting mechanism 129, the pre-wet tank 132, the pre-soak tank 133, the pre-rinse tank 134, the blow tank 135, the rinse tank 136, and the plating device 139.

Figure 2:
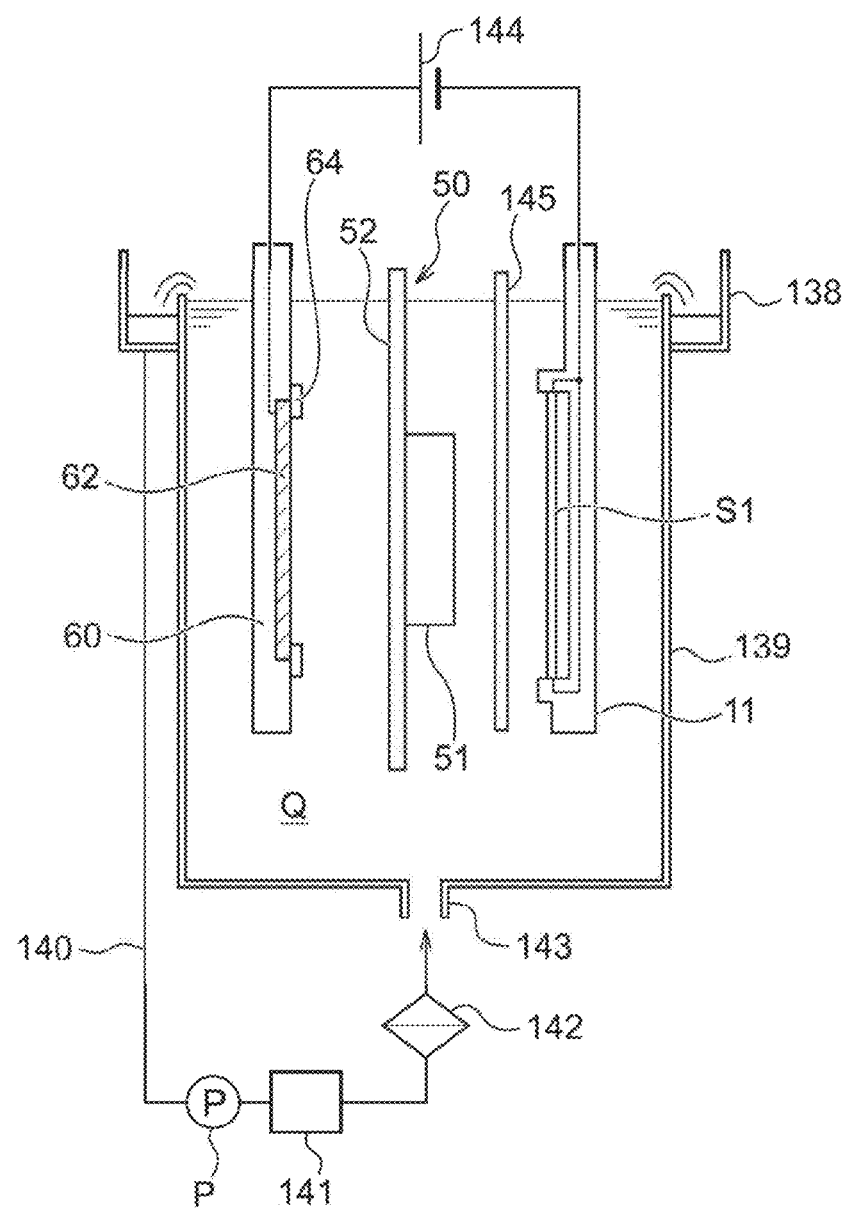
FIG. 2 is a schematic longitudinal front view illustrating a plating device and an overflow tank of a processing unit illustrated in FIG. 1.

FIG. 2 is a schematic longitudinal front view illustrating the plating device 139 and the overflow tank 138 of the plating processing unit 102B illustrated in FIG. 1. As illustrated in FIG. 2, the plating device 139 internally holds a plating solution Q. The overflow tank 138 is disposed around an outer periphery of the plating device 139 so as to hold the plating solution Q overflown from an edge of the plating device 139. The overflow tank 138 has a bottom with which one end of a plating solution supply passage 140 including a pump P is connected. The plating solution supply passage 140 has the other end connected with a plating solution inlet 143 disposed on the bottom of the plating device 139. This causes the plating solution Q accumulated in the overflow tank 138 to return into the plating device 139 in association with the driving of the pump P. In the plating solution supply passage 140, a thermostat 141, which adjusts a temperature of the plating solution Q, and a filter 142, which removes foreign matter in the plating solution, are disposed in the downstream side of the pump P.

The plating device 139 houses a substrate holder 11 that holds a polygonal substrate S1. The substrate holder 11 is disposed in the plating device 139 such that the polygonal substrate S1 is immersed in the plating solution Q in a vertical state. At a position facing the polygonal substrate S1 in the plating device 139, an anode 62 held by an anode holder 60 is arranged. As the anode 62, for example, phosphorus-containing copper may be used. The anode holder 60 has a front surface side (side that faces the polygonal substrate S1) that includes an anode mask 64 that shields a part of the anode 62. The anode mask 64 has an opening that passes a line of electric force between the anode 62 and the polygonal substrate S1 through. The polygonal substrate S1 is electrically connected with the anode 62 via a plating power supply 144. Flowing a current between the polygonal substrate S1 and the anode 62 forms a plating film (copper film) on the surface of the polygonal substrate S1.

Between the polygonal substrate S1 and the anode 62, a paddle 145 that reciprocates in parallel with the surface of the polygonal substrate S1 to stir the plating solution Q is disposed. Stirring the plating solution Q with the paddle 145 ensures uniformly supplying sufficient copper ions on the surface of the polygonal substrate S1. Between the paddle 145 and the anode 62, a regulation plate 50 made of a dielectric material to make an electric potential distribution over the whole surface of the polygonal substrate S1 further uniform is arranged. The regulation plate 50 has a plate-shaped main body 52. This main body 52 has a tubular edge 51 that forms an opening to pass the line of electric force through. The regulation plate 50 is configured to adjust the current between the anode 62 and the polygonal substrate S1.

Figure 3:
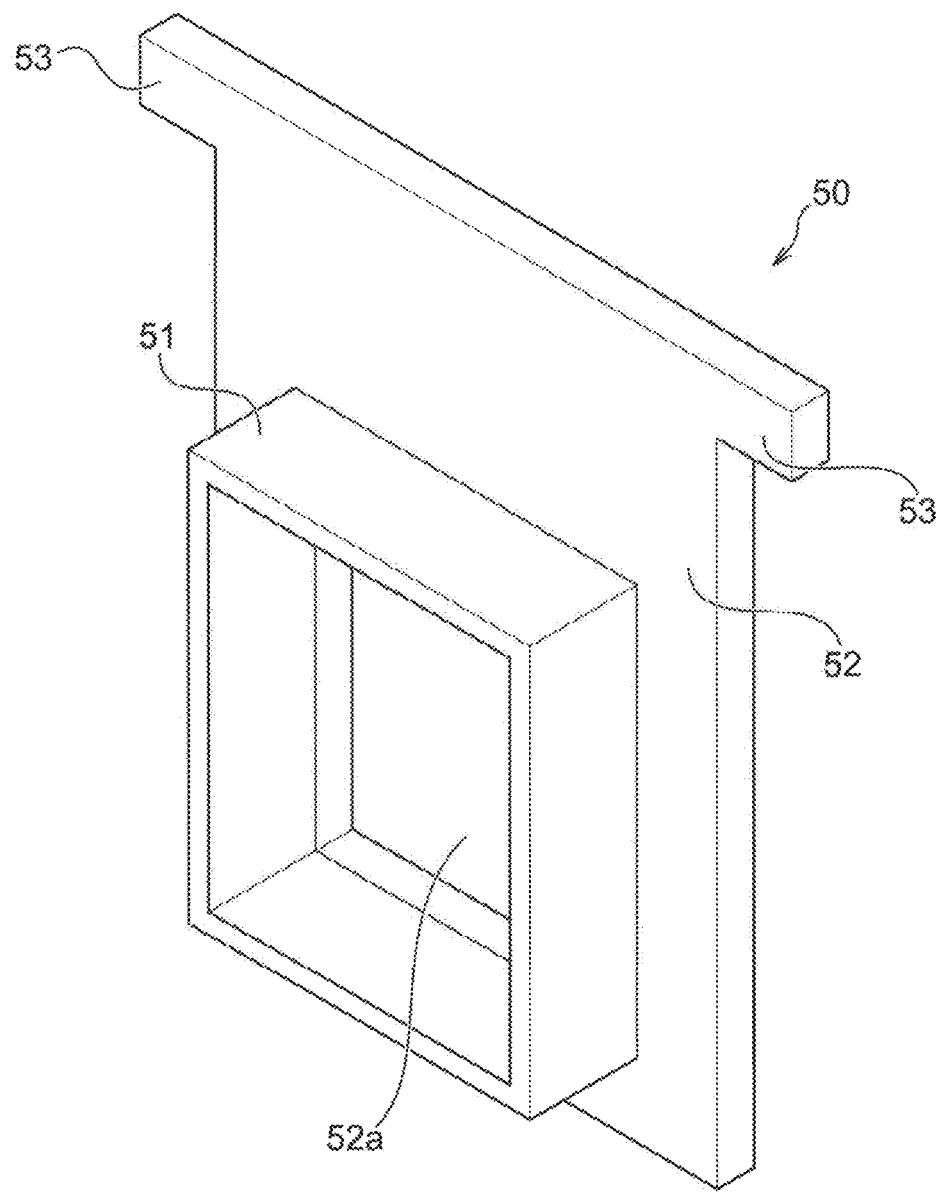
FIG. 3 is a schematic perspective view of a regulation plate.

Next, a description will be given of a shape of the regulation plate 50, the anode holder 60, and the substrate holder 11 illustrated in FIG. 2. FIG. 3 is a schematic perspective view of the regulation plate 50. As illustrated in FIG. 3, the main body 52 of the regulation plate 50 has an approximately rectangular plate shape as a whole. The regulation plate 50 has an upper portion whose lateral ends has a pair of hangers 53 to hang the regulation plate 50 on a top surface of a peripheral wall of the plating device 139 illustrated in FIG. 1 and FIG. 2. The main body 52 has a polygonal opening 52a approximately in the center thereof. This polygonal opening 52a is formed by the edge 51 disposed in the main body 52.

Figure 4:
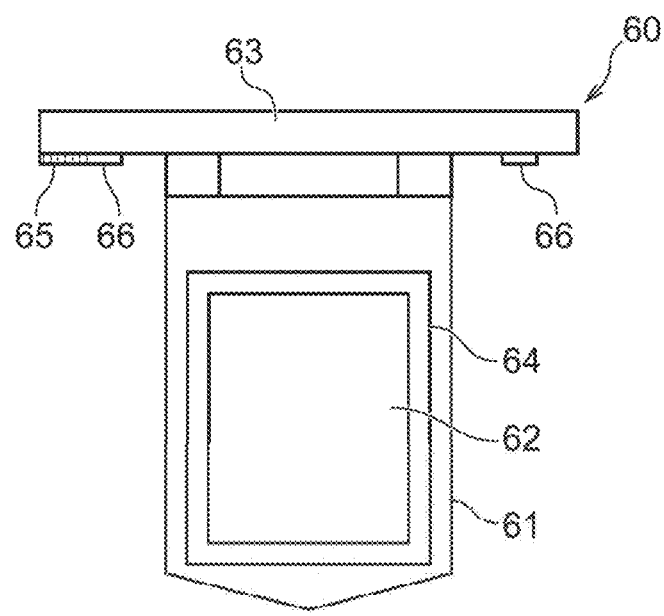
FIG. 4 is a schematic plan view of an anode holder.

FIG. 4 is a schematic plan view of the anode holder 60 illustrated in FIG. 2. As illustrated in FIG. 4, the anode holder 60 has a holder main body 61 in a flat plate shape and an arm 63 connected with the holder main body 61. The arm 63 has a pair of pedestals 66. Installing the pedestals 66 on the top surface of the peripheral wall of the plating device 139 illustrated in FIG. 1 perpendicularly hangs and supports the anode holder 60. The arm 63 includes a connector 65 configured to be brought into contact with an electric contact disposed in the plating device 139 when the pedestals 66 are installed on the top surface of the peripheral wall of the plating device 139. This electrically connects the anode holder 60 with the plating power supply 144 illustrated in FIG. 2, and a voltage (current) is applied to the anode 62.

The anode holder 60 holds the anode 62, and this anode 62 has a peripheral portion shielded by the anode mask 64. As illustrated in FIG. 4, the anode mask 64 has a rectangular opening (polygonal opening). Accordingly, the anode 62 is held by the anode holder 60 so as to be exposed from the polygonal opening of the anode mask 64 in the plan view illustrated in FIG. 4.

Figure 5:
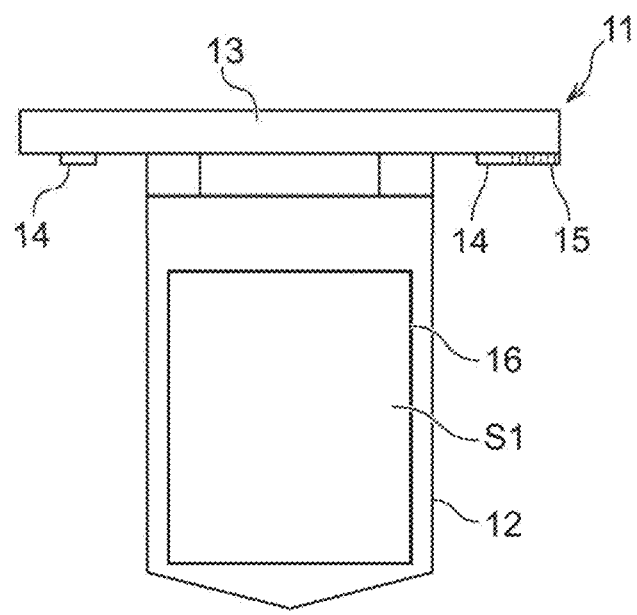
FIG. 5 is a schematic plan view of a substrate holder.

FIG. 5 is a schematic plan view of the substrate holder 11. As illustrated in FIG. 5, the substrate holder 11 has a flat plate-shaped holder main body 12 made of, for example, vinyl chloride and an arm 13 connected with the holder main body 12. The arm 13 has a pair of pedestals 14. Installing the pedestals 14 on the top surface of the peripheral wall of each processing tank illustrated in FIG. 1 perpendicularly hangs and supports the substrate holder 11. The arm 13 includes a connector 15 configured to be in contact with an electric contact disposed in the plating device 139 when the pedestals 14 are installed on the top surface of the peripheral wall of the plating device 139. This electrically connects the substrate holder 11 with the plating power supply 144 illustrated in FIG. 2, and a voltage (current) is applied to the polygonal substrate S1 held by the substrate holder 11.

The substrate holder 11 holds the polygonal substrate S1 such that a surface to be plated of the polygonal substrate S1 illustrated in FIG. 5 is exposed. In other words, the substrate holder 11 has an edge 16 that forms the polygonal opening to expose the held polygonal substrate S1. The substrate holder 11 has an electric contact (not illustrated) that is brought into contact with the surface of the polygonal substrate S1. When the substrate holder 11 holds the polygonal substrate S1, this electric contact is, for example, brought into contact with the surface of the polygonal substrate S1 along two sides that oppose the polygonal substrate S1. Note that, the shape of the polygonal substrate S1 is a square shape or a rectangular shape. In the case of the rectangular polygonal substrate, the electric contact is configured to be brought into contact with two sides that oppose any one of a long side or a short side of the rectangular polygonal substrate.

As described above, it is possible that, in the polygonal substrate S1, there are some cases where the wiring patterns and the like disposed on the polygonal substrate S1 are not uniform, and the pattern densities or the pattern shapes may differ depending on the position. In this case, plating the polygonal substrate S1 requires to thicken or thin the plating film thickness only on a predetermined portion on the polygonal substrate S1 unlike the plating of the circular-shaped substrate. Accordingly, in the plating of the polygonal substrate S1, it is preferred that the film thickness of the plating can be purposely controlled partially or locally within the surface of the substrate. Therefore, in the embodiment, a shielding member that is mounted on at least one of the regulation plate 50, the anode holder 60, and the substrate holder 11 is used in order to partially or locally control the film thickness of plating formed on the polygonal substrate S1.

Figure 6:
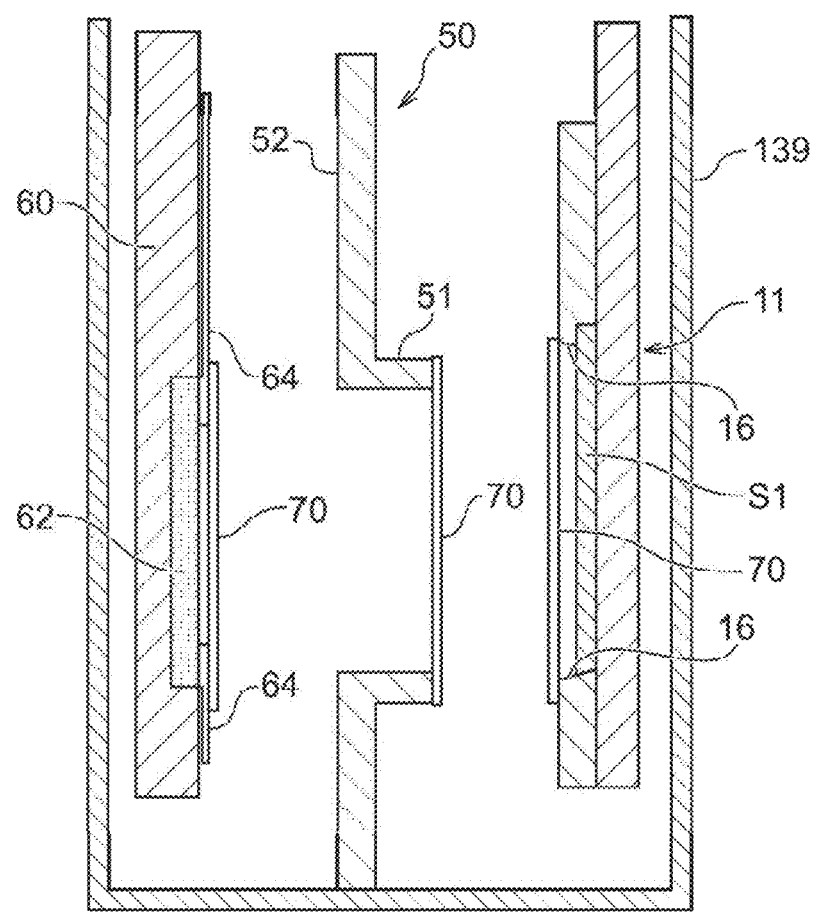
FIG. 6 is a schematic cross-sectional view of the plating device in which the regulation plate, the anode holder, and the substrate holder on which shielding members are mounted are stored according to the embodiment.

FIG. 6 is a schematic cross-sectional view of the plating device 139 in which the regulation plate 50, the anode holder 60, and the substrate holder 11 on which the shielding members are mounted are stored according to the embodiment. Note that, in FIG. 6, a part of the configuration illustrated in FIG. 2 is not illustrated. As illustrated in FIG. 6, shielding members 70 are attachably/detachably mounted on the regulation plate 50, the anode holder 60, and the substrate holder 11. Specifically, the shielding member 70 is mounted on a distal end close to the substrate holder 11 of the edge 51 of the regulation plate 50 to shield a part of the polygonal opening 52a of the regulation plate 50. Note that the shielding member 70 may be mounted on a side far from the substrate holder 11 of the regulation plate 50. However, the shielding member 70 can effectively adjust the thickness of the plating film formed on the polygonal substrate S1 when the shielding member 70 is mounted on the side close to the substrate holder 11 of the regulation plate 50 as illustrated in FIG. 6. The shielding member 70 is mounted on the anode mask 64 of the anode holder 60 to shield a part of the polygonal opening of the anode mask 64. Similarly, the shielding member 70 is also mounted on the edge 16 of the substrate holder 11 to shield a part of the polygonal opening of the substrate holder 11.

The shielding member 70 is formed of, for example, a dielectric material, and can adjust an electric field between the anode holder 60, the regulation plate 50, and the substrate holder 11. Note that, while in the example illustrated in FIG. 6, the respective shielding members 70 are mounted on the regulation plate 50, the anode holder 60, and the substrate holder 11, it is not limited to this. That is, mounting the shielding member 70 on at least one of the regulation plate 50, the anode holder 60, and the substrate holder 11 ensures partially or locally thickening or thinning the thickness of the plating film formed on the polygonal substrate S1.

FIG. 7A to FIG. 7F are schematic plan views illustrating examples of the shielding member 70 that can be mounted on the regulation plate 50, the anode holder 60, and the substrate holder 11. The shielding member 70 may be mounted on the polygonal opening 52a of the regulation plate 50, the polygonal opening of the anode holder 60, and the polygonal opening of the substrate holder 11 so as to shield a part of the current passing through the polygonal opening 52a of the regulation plate 50, the polygonal opening of the anode holder 60, and the polygonal opening of the substrate holder 11. An edge 72 illustrated in FIG. 7A to FIG. 7F is used as a general term of an edge that forms the polygonal opening 52a of the regulation plate 50, the polygonal opening of the anode holder 60, and the polygonal opening of the substrate holder 11.

Figure 7A:
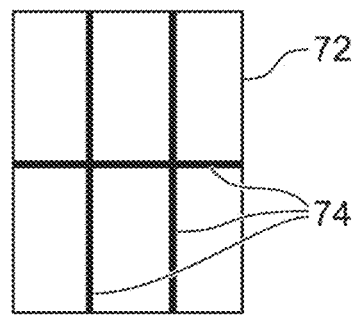
FIG. 7A is a schematic plan view illustrating an exemplary shielding member that can be mounted on the regulation plate, the anode holder, and the substrate holder.
Figure 7B:
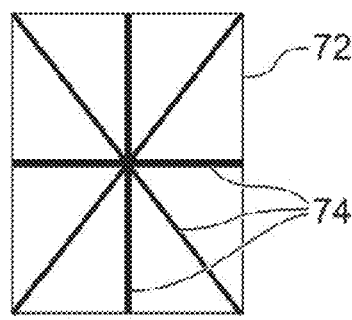
FIG. 7B is a schematic plan view illustrating an exemplary shielding member that can be mounted on the regulation plate, the anode holder, and the substrate holder.

In the examples illustrated in FIG. 7A and FIG. 7B, partition members 74 as an example of the shielding member 70 may be mounted on the edge 72. In the examples illustrated in the drawings, the partition members 74 are straight rod-shaped members and are configured to divide the polygonal opening into a plurality of compartments. In the example illustrated in FIG. 7A, two partition members 74 in the vertical direction and one partition member 74 in the lateral direction are mounted across from one side of the edge 72 to the other. In the example illustrated in FIG. 7B, one partition member 74 is mounted in the vertical direction, one partition member 74 is mounted in the lateral direction, and two partition members 74 are mounted on diagonal lines across from one side of the edge 72 to the other. The partition member 74 can be mounted on the edge 72 with any securing means, such as bolts or screws. When the plurality of compartments having a predetermined wiring pattern are formed on the polygonal substrate S1, as illustrated in FIG. 7A and FIG. 7B, dividing the polygonal opening with the partition members 74 into the plurality of compartments ensures adjusting the film thicknesses corresponding to the respective compartments. Note that the partition member 74 can be mounted, not on the edge 72, but on any positions, such as the main body 52 of the regulation plate 50, the holder main body 61 of the anode holder 60, or the holder main body 12 of the substrate holder 11.

Figure 7C:
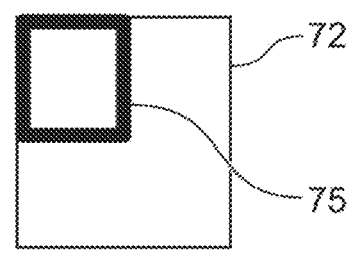
FIG. 7C is a schematic plan view illustrating an exemplary shielding member that can be mounted on the regulation plate, the anode holder, and the substrate holder.
Figure 7D:
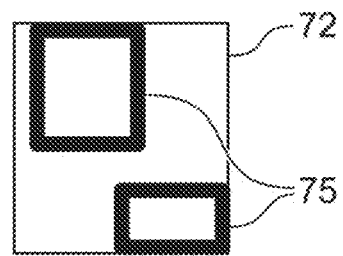
FIG. 7D is a schematic plan view illustrating an exemplary shielding member that can be mounted on the regulation plate, the anode holder, and the substrate holder.

In the examples illustrated in FIG. 7C and FIG. 7D, partition members 75 as an example of the shielding member 70 may be mounted on the edge 72. In the examples illustrated in the drawings, the partition members 75 are frame-shaped members. Accordingly, the partition member 75 being mounted on the edge 72 ensures dividing the polygonal opening into the plurality of compartments. In the example illustrated in FIG. 7C, the partition member 75 is mounted so as to fit on corner of the edge 72. In the example illustrated in FIG. 7D, one partition member 75 is mounted so as to fit on corner of the edge 72, and the other partition member 74 is mounted so as to fit on a side of the edge 72. Note that the partition member 75 can be mounted, not on the edge 72, but on any positions, such as the main body 52 of the regulation plate 50, the holder main body 61 of the anode holder 60, or the holder main body 12 of the substrate holder 11.

Figure 7E:
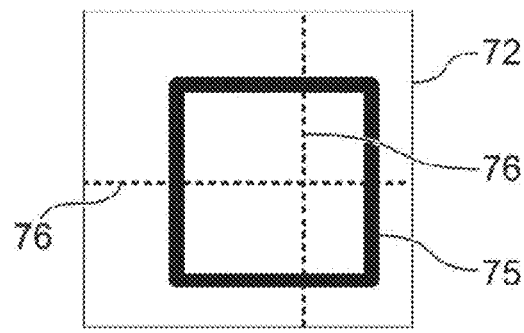
FIG. 7E is a schematic plan view illustrating an exemplary shielding member that can be mounted on the regulation plate, the anode holder, and the substrate holder.
Figure 7F:
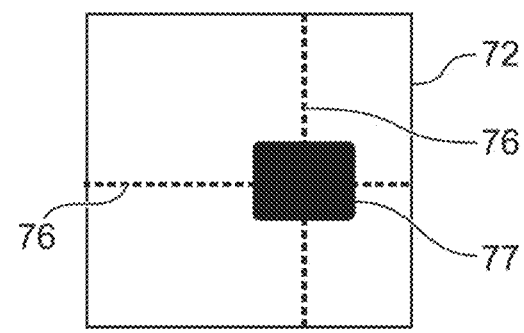
FIG. 7F is a schematic plan view illustrating an exemplary shielding member that can be mounted on the regulation plate, the anode holder, and the substrate holder.

In the examples illustrated in FIG. 7E and FIG. 7F, shaft-shaped supporting members 76 are disposed on the edge 72. As illustrated in FIG. 7E and FIG. 7F, one supporting member 76 is mounted in the vertical direction and one supporting member 76 is mounted on the lateral direction so as to be across the polygonal opening. The supporting member 76 can be mounted on the edge 72 with any securing means, such as bolts or screws. The supporting member 76 is formed of a member that is thin so as to make an influence on the current passing through the polygonal opening negligible. Accordingly, even though the supporting member 76 is disposed to be across the polygonal opening, the supporting member 76 hardly gives influence on the film-thickness distribution of the plating film formed on the polygonal substrate S1. Note that the supporting member 76 can be mounted, not on the edge 72, but on any positions, such as the main body 52 of the regulation plate 50, the holder main body 61 of the anode holder 60, or the holder main body 12 of the substrate holder 11.

As illustrated in FIG. 7E, the frame-shaped partition member 75 is attachably/detachably mounted on the supporting member 76. As illustrated in FIG. 7F, a shielding plate 77 as one example of the shielding member 70 is attachably/detachably mounted on the supporting member 76. The partition member 75 and the shielding plate 77 can be mounted on the supporting member 76 with any securing means, such as bolts or screws. Thus, in the examples illustrated in FIG. 7E and FIG. 7F, the partition member 75 and the shielding plate 77 can be disposed on the polygonal opening via the supporting member 76, and thus, it is not necessary to directly mounting the partition member 75 and the shielding plate 77 on the edge 72. This is particularly beneficial when the influence of the partition member 75 and the shielding plate 77 is not desired on the plating film near the outer periphery of the polygonal substrate S1. Note that the shielding plate 77 may be mounted on the partition member 75 with any securing means.

FIG. 8A to FIG. 8D are schematic plan views illustrating other examples of the shielding member 70. In the examples illustrated in FIG. 8A to FIG. 8D, the frame-shaped partition member 75 as one example of the shielding member 70 is mounted so as to fit on a corner of the edge 72. One supporting member 76 is disposed in the vertical direction and one supporting member 76 is disposed in the lateral direction so as to be across the opening of this partition member 75. The supporting member 76 can be mounted on the partition member 75 with any securing means, such as bolts or screws.

Figure 8A:
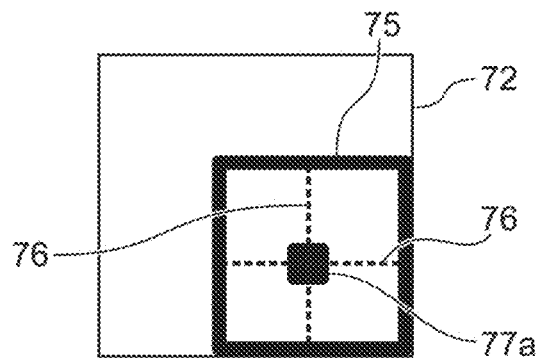
FIG. 8A is a schematic plan view illustrating another exemplary shielding member.
Figure 8B:
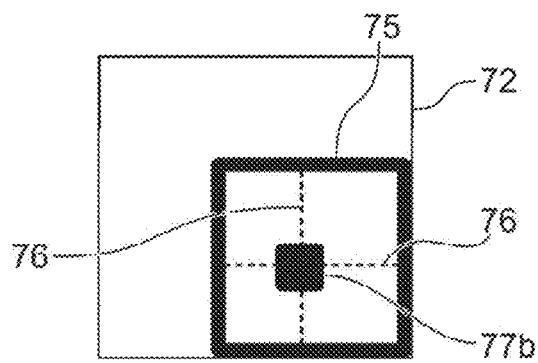
FIG. 8B is a schematic plan view illustrating another exemplary shielding member.
Figure 8C:
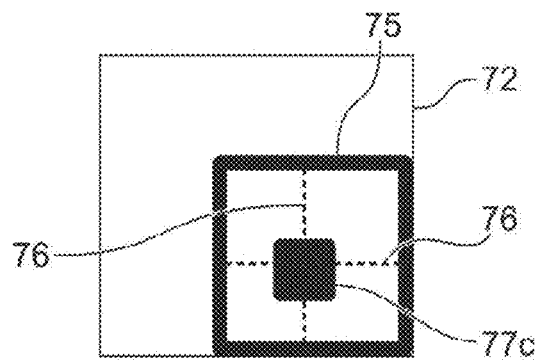
FIG. 8C is a schematic plan view illustrating another exemplary shielding member.
Figure 8D:
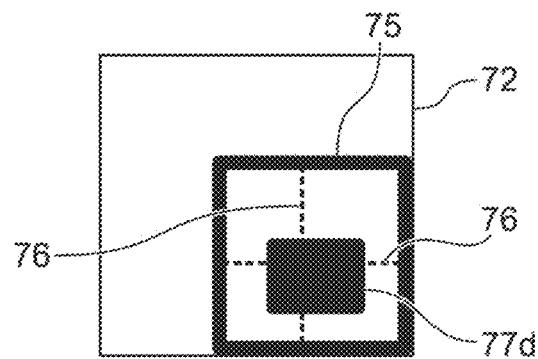
FIG. 8D is a schematic plan view illustrating another exemplary shielding member.
Figure 9A:
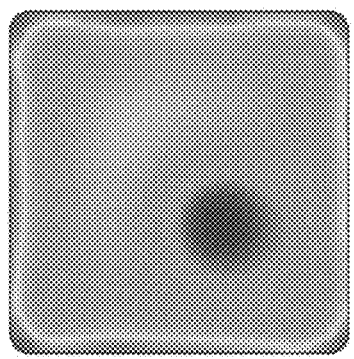
FIG. 9A illustrates an exemplary film-thickness distribution of a plating film formed on the polygonal substrate when the shielding member in FIG. 8A is mounted on the regulation plate.
Figure 9B:
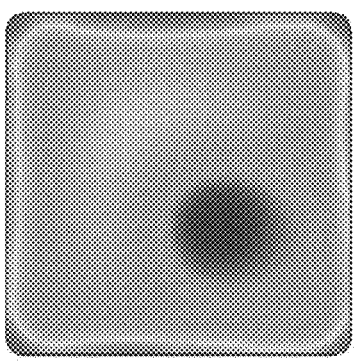
FIG. 9B illustrates an exemplary film-thickness distribution of a plating film formed on the polygonal substrate when the shielding member in FIG. 8B is mounted on the regulation plate.
Figure 9C:
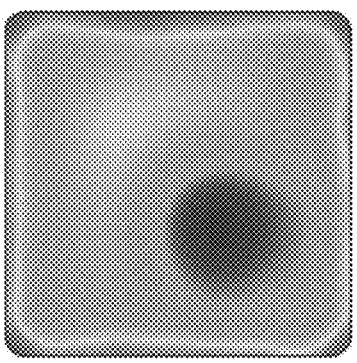
FIG. 9C illustrates an exemplary film-thickness distribution of a plating film formed on the polygonal substrate when the shielding member in FIG. 8C is mounted on the regulation plate.
Figure 9D:
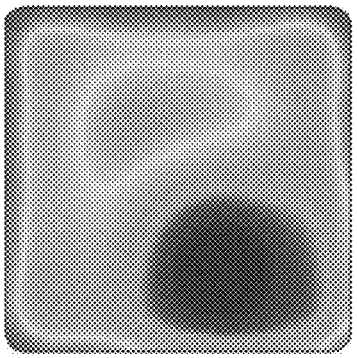
FIG. 9D illustrates an exemplary film-thickness distribution of a plating film formed on the polygonal substrate when the shielding member in FIG. 8D is mounted on the regulation plate.

In the example illustrated in FIG. 8A, a shielding plate 77a is mounted at an intersection of two supporting members 76. In the example illustrated in FIG. 8B, a shielding plate 77b larger than the shielding plate 77a in size is mounted at an intersection of two supporting members 76. In the example illustrated in FIG. 8C, a shielding plate 77c larger than the shielding plate 77b in size is mounted at an intersection of two supporting members 76. In the example illustrated in FIG. 8D, a shielding plate 77d larger than the shielding plate 77c in size is mounted at an intersection of two supporting members 76.

FIG. 9A to FIG. 9D illustrate respective examples of film-thickness distributions of the plating film formed on the polygonal substrate S1 when the shielding members 70 in FIG. 8A to FIG. 8D are mounted on the regulation plate 50. According to the film-thickness distribution diagram illustrated in FIG. 9A, the film thickness of a portion corresponding to the shielding plate 77a illustrated in FIG. 8A is thin compared with the other portion. According to the film-thickness distribution diagrams illustrated in FIG. 9B, FIG. 9C, and FIG. 9D, as shielding sizes by the shielding plate 77b, the shielding plate 77c, and the shielding plate 77d increase, regions of thin portions in film thicknesses expand. In association with this, when the polygonal opening is shielded by the shielding plate 77d having the largest shielding size, the film thickness of the portion of the polygonal substrate S1 corresponding to the shielded portion is the thinnest according to FIG. 9D.

As described above, the embodiment ensures shielding a part of the polygonal opening by mounting the shielding member 70 including the partition member 74, the partition member 75, the shielding plate 77, and the like, on at least one of the regulation plate 50, the anode holder 60, and the substrate holder 11. This ensures partially or locally controlling the plating film thickness on the polygonal substrate S1. Eventually, it is possible to achieve intentionally forming a non-uniform film thickness, which is not usually required in the case of the circular-shaped substrate.

In particular, there are some cases where a plurality of sets of predetermined wiring patterns are formed on the polygonal substrate S1. In such a case, dividing the polygonal opening into the plurality of compartments with the partition member 74 or the partition member 75 so as to correspond to a boundary between a pair of the neighboring wiring patterns ensures adjusting the film thicknesses corresponding to the respective partitions.

Furthermore, using the supporting member 76 ensures mounting the shielding member 70 in a position away from the edge 72, thereby ensuring the adjusted plating film thickness in a desired position on the polygonal substrate S1. This is particularly beneficial when the influence of the shielding member 70 is not desired on the plating film near the periphery of the polygonal substrate S1.

As illustrated in FIG. 8A to FIG. 8D, the shielding plate 77 can be disposed via the supporting member 76 in a region partitioned by the partition member 74 or the partition member 75. Accordingly, dividing the polygonal opening into the plurality of compartments and disposing the shielding plates 77 in the respective compartments also ensures the adjusted plating film thicknesses on the polygonal substrate S1 corresponding to the respective compartments. Note that, when the polygonal opening is partitioned by the partition member 74 or the partition member 75, the shielding plate 77 may be directly mounted on the partition member 74 or the partition member 75, instead of disposing the shielding plate 77 via the supporting member 76 as illustrated in FIG. 8A to FIG. 8D.

The embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective constituent elements according to claims and specification in a range in which at least a part of the above-described problems can be solved, or a range in which at least a part of the effects can be exhibited.

The following describes some configurations disclosed by this specification.

According to a first configuration, there is provided a regulation plate for adjusting a current between an anode and a polygonal substrate. This regulation plate includes a main body and an attachable/detachable shielding member. The main body has an edge forming a polygonal opening through which the current passes. The shielding member is to shield at least a part of the polygonal opening.

With the first configuration, the shielding member can be mounted on the regulation plate to shield a part of the polygonal opening. This ensures partially or locally controlling the plating film thickness on the polygonal substrate. Eventually, it is possible to achieve intentionally forming a non-uniform film thickness, which is not usually required in the case of the circular-shaped substrate.

According to a second configuration, in the regulation plate according to the first configuration, the shielding member includes a partition member configured to divide the polygonal opening into a plurality of compartments.

There are some cases where a plurality of sets of predetermined wiring patterns are formed on the polygonal substrate. With the second configuration, dividing the polygonal opening into the plurality of compartments with the partition member so as to correspond to a boundary between the wiring patterns ensures adjusting the film thicknesses corresponding to the respective compartments in such a case.

According to a third configuration, in the regulation plate according to the first or the second configuration, the regulation plate includes a shaft-shaped supporting member disposed to be across the polygonal opening, and the shielding member includes a shielding plate attachably/detachably mounted on the supporting member.

With the third configuration, using the supporting member ensures mounting the shielding member in a position away from the edge of the regulation plate. This ensures the adjusted plating film thickness in a desired position on the polygonal substrate. This is particularly beneficial when the influence of the shielding member is not desired on the plating film near the periphery of the polygonal substrate.

According to a fourth configuration, in the regulation plate according to the third configuration, the shielding plate is attachably/detachably mounted on the supporting member without contacting the main body.

With the fourth configuration, using the supporting member ensures mounting the shielding member in a position away from the edge of the regulation plate. This ensures the adjusted plating film thickness in a desired position on the polygonal substrate. This is particularly beneficial when the influence of the shielding member is not desired on the plating film near the periphery of the polygonal substrate.

According to a fifth configuration, in the regulation plate according to the second configuration, the partition member partitions the polygonal opening to form a plurality of openings. The regulation plate further includes a shaft-shaped supporting member disposed to be across at least one of the plurality of openings. The shielding member includes a shielding plate attachably/detachably mounted on the supporting member.

With the fifth configuration, dividing the polygonal opening into the plurality of compartments and disposing the shielding plates in the respective compartments ensure the adjusted plating film thicknesses on the polygonal substrate corresponding to the respective compartments.

According to a sixth configuration, there is provided an anode holder configured to hold an anode. This anode holder includes a holder main body, an anode mask, and an attachable/detachable shielding member. The holder main body holds the anode. The anode mask is mounted on the holder main body. The anode mask has a polygonal opening. The anode mask shields a peripheral portion of the anode. The shielding member is to shield at least a part of the polygonal opening.

With the sixth configuration, the shielding member can be mounted on the anode holder to shield a part of the polygonal opening. This ensures partially or locally controlling the plating film thickness on the polygonal substrate. Eventually, it is possible to achieve intentionally forming a non-uniform film thickness, which is not usually required in the case of the circular-shaped substrate.

According to a seventh configuration, in the anode holder according to the sixth configuration, the shielding member includes a partition member configured to divide the polygonal opening into a plurality of compartments.

There are some cases where a plurality of sets of predetermined wiring patterns are formed on the polygonal substrate. With the seventh configuration, dividing the polygonal opening into the plurality of compartments with the partition member so as to correspond to a boundary between the wiring pattern and the wiring pattern ensures adjusting the film thicknesses corresponding to the respective compartments in such a case.

According to an eighth configuration, in the anode holder according to the sixth or the seventh configuration, the anode holder includes a shaft-shaped supporting member disposed to be across the polygonal opening, and the shielding member includes a shielding plate attachably/detachably mounted on the supporting member.

With the eighth configuration, using the supporting member ensures mounting the shielding member in a position away from the edge of the anode mask. This ensures the adjusted plating film thickness in a desired position on the polygonal substrate. This is particularly beneficial when the influence of the shielding member is not desired on the plating film near the periphery of the polygonal substrate.

According to a ninth configuration, in the anode holder according to the eighth configuration, the shielding plate is attachably/detachably mounted on the supporting member without contacting the holder main body and the anode mask.

With the ninth configuration, using the supporting member ensures mounting the shielding member in a position away from the edge of the anode mask. This ensures the adjusted plating film thickness in a desired position on the polygonal substrate. This is particularly beneficial when the influence of the shielding member is not desired on the plating film near the periphery of the polygonal substrate.

According to a tenth configuration, in the anode holder according to the seventh configuration, the partition member partitions the polygonal opening to form a plurality of openings. The anode holder further includes a shaft-shaped supporting member disposed to be across at least one of the plurality of openings. The shielding member includes a shielding plate attachably/detachably mounted on the supporting member.

With the tenth configuration, dividing the polygonal opening into the plurality of compartments and disposing the shielding plates in the respective compartments ensure the adjusted plating film thicknesses on the polygonal substrate corresponding to the respective compartments.

According to an eleventh configuration, there is provided a substrate holder for holding a polygonal substrate. This substrate holder includes a holder main body and an attachable/detachable shielding member. The holder main body has an edge forming a polygonal opening to expose the held polygonal substrate. The shielding member is to shield at least a part of the polygonal opening.

With the eleventh configuration, the shielding member can be mounted on the substrate holder to shield a part of the polygonal opening. This ensures partially or locally controlling the plating film thickness on the polygonal substrate. Eventually, it is possible to achieve intentionally forming a non-uniform film thickness, which is not usually required in the case of the circular-shaped substrate.

According to a twelfth configuration, in the substrate holder according to the eleventh configuration, the shielding member includes a partition member configured to divide the polygonal opening into a plurality of compartments.

There are some cases where a plurality of sets of predetermined wiring patterns are formed on the polygonal substrate. With the twelfth configuration, dividing the polygonal opening into the plurality of compartments with the partition member so as to correspond to a boundary between the wiring pattern and the wiring pattern ensures adjusting the film thicknesses corresponding to the respective compartments in such a case.

According to a thirteenth configuration, in the substrate holder according to the eleventh or the twelfth configuration, the substrate holder includes a shaft-shaped supporting member disposed to be across the polygonal opening, and the shielding member includes a shielding plate attachably/detachably mounted on the supporting member.

With the thirteenth configuration, using the supporting member ensures mounting the shielding member in a position away from the edge of the substrate holder. This ensures the adjusted plating film thickness in a desired position on the polygonal substrate. This is particularly beneficial when the influence of the shielding member is not desired on the plating film near the periphery of the polygonal substrate.

According to a fourteenth configuration, in the substrate holder according to the thirteenth configuration, the shielding plate is attachably/detachably mounted on the supporting member without contacting the holder main body.

With the fourteenth configuration, using the supporting member ensures mounting the shielding member in a position away from the edge of the substrate holder. This ensures the adjusted plating film thickness in a desired position on the polygonal substrate. This is particularly beneficial when the influence of the shielding member is not desired on the plating film near the periphery of the polygonal substrate.

According to a fifteenth configuration, in the substrate holder according to the twelfth configuration, the partition member partitions the polygonal opening to form a plurality of openings. The substrate holder further includes a shaft-shaped supporting member disposed to be across at least one of the plurality of openings. The shielding member includes a shielding plate attachably/detachably mounted on the supporting member.

With the fifteenth configuration, dividing the polygonal opening into the plurality of compartments and disposing the shielding plates in the respective compartments ensures the adjusted plating film thicknesses on the polygonal substrate corresponding to the respective compartments.

REFERENCE SIGNS LIST

S1 . . . polygonal substrate
11 . . . substrate holder
12 . . . holder main body
16 . . . edge
50 . . . regulation plate
51 . . . edge
52 . . . main body
52a . . . polygonal opening
60 . . . anode holder
61 . . . holder main body
62 . . . anode
64 . . . anode mask
70 . . . shielding member
72 . . . edge
74 . . . partition member
75 . . . partition member
76 . . . supporting member
77, 77a, 77b, 77c, 77d . . . shielding plate

The invention claimed is:
1. A regulation plate for adjusting a current between an anode and a polygonal substrate, the regulation plate comprising:
a main body that has an edge forming a polygonal opening through which the current passes;
an attachable/detachable shielding member to shield at least a part of the polygonal opening; and
a shaft-shaped supporting member disposed to be across the polygonal opening, wherein
the shielding member includes a shielding plate attachably/detachably mounted on the supporting member.

2. The regulation plate according to claim 1, wherein the shielding member includes a partition member configured to divide the polygonal opening into a plurality of compartments.

3. The regulation plate according to claim 1, wherein the shielding plate is attachably/detachably mounted on the supporting member without contacting the main body.

4. The regulation plate according to claim 2, wherein the partition member partitions the polygonal opening to form a plurality of openings, the regulation plate further includes a shaft-shaped supporting member disposed to be across at least one of the plurality of openings, and the shielding member includes a shielding plate attachably/detachably mounted on the supporting member.

5. A regulation plate for adjusting a current between an anode and a polygonal substrate, the regulation plate comprising:

a main body that has an edge forming a polygonal opening through which the current passes; and an attachable/detachable shielding member to shield at least a part of the polygonal opening, wherein the shielding member includes a partition member configured to divide the polygonal opening into a plurality of compartments, the partition member partitions the polygonal opening to form a plurality of openings, the regulation plate further includes a shaft-shaped supporting member disposed to be across at least one of the plurality of openings, and the shielding member includes a shielding plate attachably/detachably mounted on the supporting member.

* * * * *